United States Patent [19]

Hecken

[11] 4,274,047

[45] Jun. 16, 1981

[54] ANALYZER FOR NONLINEAR NETWORKS

[75] Inventor: Rudolf P. Hecken, Andover, Mass.

[73] Assignee: Bell Telephone Laboratories, Incorporated, Murray Hill, N.J.

[21] Appl. No.: 101,136

[22] Filed: Dec. 7, 1979

[51] Int. Cl.$^3$ ............... G01R 27/00; G01R 27/04
[52] U.S. Cl. ....................... 324/57 R; 324/58 A; 328/163
[58] Field of Search ............... 324/57 R, 58 A, 84, 324/95; 328/162, 163

[56] References Cited

U.S. PATENT DOCUMENTS

| | | | |
|---|---|---|---|
| 3,522,526 | 8/1970 | Sanderson | 324/58 A |
| 3,596,175 | 7/1971 | Alford | 324/57 R X |
| 3,663,954 | 5/1972 | Alker | 324/57 R |
| 4,048,559 | 9/1977 | Miedema | 324/58 A X |
| 4,104,583 | 8/1978 | Engen | 324/58 A |

*Primary Examiner*—Stanley T. Krawczewicz
*Attorney, Agent, or Firm*—Sylvan Sherman

[57] ABSTRACT

This application describes a method and apparatus for measuring the transmission characteristics of a class of nonlinear two-ports containing physically inseparable reactive networks, but which can be characterized by an equivalent network comprising input and output linear reactive networks separated by a resistive nonlinear network. In accordance with the method, three signals, $f_1$, $f_2$ and $f_3$, are applied to the test network where signals $f_2$ and $f_3$ are variable and differ by a relatively small amount $\Delta f$. So related, the third order intermod frequency, $f_p = f_1 - f_2 + f_3$, becomes a constant $f_p = f_1 + \Delta f$. It is further shown that the magnitude of the output voltage $V_p$ at frequency $f_p$ is proportional to the square of the magnitude of the input network transfer function $H_A(f)$.

7 Claims, 3 Drawing Figures

ANALYZER FOR NONLINEAR NETWORKS

TECHNICAL FIELD

This invention relates to a method and apparatus for measuring the transmission characteristic of a class of nonlinear two-ports containing physically inseparable reactive networks.

BACKGROUND OF THE INVENTION

For the effective cancellation of intermodulation distortion generated in nonlinear devices such as mixers, amplifiers, etc., by means of predistortion or postdistortion techniques, it is advantageous to have precise knowledge of the frequency dependence of this distortion. Moreover, it is important to know the nature of the frequency dependence both before and after the nonlinear element. Unfortunately, it is often impossible to physically separate the linear reactive circuitry from the embedded nonlinear element which is, for example, the case in a travelling wave tube. Thus, a direct measurement of the transfer characteristic of the frequency dependent portion of the nonlinear circuit is not feasible. Nor are currently known distortion measuring techniques capable of distinguishing among the various frequency selective effects. For example, U.S. Pat. No. 3,663,954 discloses a method of measuring intermodulation distortion by applying two bands of noise and a fixed tone to the device under test. The measured distortion gives an integrated indication of the level of intermodulation across the entire band of interest. It cannot reveal the nature of the frequency characteristics of the test device. In a second U.S. Pat. No. 4,048,559, the intermodulation produced by a pair of swept frequency signals is measured. The measurement, however, is a function of the reactive circuitry both ahead of and after the nonlinear portion of the test device. As such, there is no way to distinguish the separate effects of the input and the output reactive portions of the device upon the intermodulation. Without this information, the ability to apply predistortion or postdistortion correction to the nonlinear device is seriously impaired.

SUMMARY OF THE INVENTION

The present invention permits the precise measurement of the transmission characteristics of an important class of nonlinear two-ports containing physically inseparable network portions. This class of two-ports is characterized by a model that includes a linear input portion having a transfer characteristic $H_A(f)$, a linear output portion having a transfer characteristic $H_B(f)$, and a resistive, nonlinear portion therebetween. In accordance with the invention, the method of measurement includes the steps of applying to the test device a first signal at a constant frequency $f_1$; applying a second signal having a variable frequency $f$; applying a third signal having a variable frequency $f+\Delta f$, where $\Delta f$ is a constant difference frequency that is small compared to $f$; and measuring the magnitude of the output signal from the test device at a constant frequency $f_1+\Delta f$ as frequency $f$ is varied. It is shown that the output signal is a function of the square of the magnitude of the transfer function $H_A(f)$, thus permitting a direct measurement of $|H_A(f)|$ as $f$ is varied. Once $|H_A(f)|$ is known, $|H_B(f)|$ can be determined.

DETAILED DESCRIPTION

Figure 1:
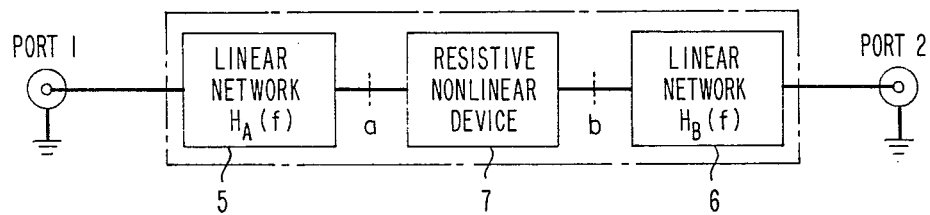
FIG. 1 shows, in block diagram, a model of the test device to be measured.

Referring to the drawings, FIG. 1 shows, in block diagram, a two-port, nonlinear network containing physically inseparable linear reactive network portions. This class of network can, for some purposes, be characterized by the model shown in FIG. 1 as comprising: an input linear network portion 5 having a transfer characteristic $H_A(f)$; an output linear network portion 6 having a transfer characteristic $H_B(f)$; and a resistive nonlinear device 7 disposed between the linear network portions.

Figure 2:
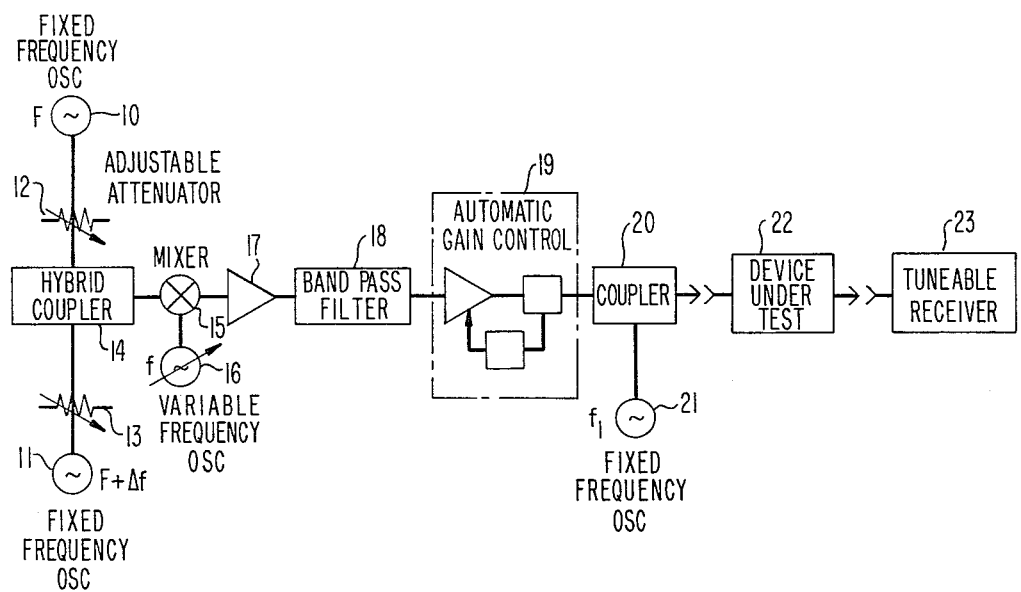
FIG. 2 shows an illustrative embodiment of a test circuit for measuring the device of FIG. 1.

In order to devise a predistortion or postdistortion system capable of effectively cancelling the intermodulation distortion generated by such a two-port, the transfer characteristics of the linear networks 5 and 6 must be known. FIG. 2, now to be considered, shows in block diagram an illustrative embodiment of a test circuit for determining these characteristics. The circuit comprises a pair of fixed frequency oscillators 10 and 11 whose output signals are coupled, by means of adjustable attenuators 12 and 13, respectively, to a hybrid coupler 14 wherein they are combined and coupled to a mixer 15. Also coupled to mixer 15 is a variable frequency oscillator 16. The resulting mixer output signal is amplified in amplifier 17, and band limited by means of a bandpass filter 18.

To insure a constant level of input signal to the test device, the band limited signal derived from filter 18 is passed through an automatic gain control circuit 19 before entering coupler 20 wherein a signal from a fixed frequency oscillator 21 is added. The output from coupler 20 is applied to the device under test 22 and the resulting intermodulation is coupled to and measured in tunable receiver 23.

As indicated hereinabove, the signal applied to the device under test includes a constant frequency signal and two variable frequency signals. The latter are obtained by mixing the two fixed frequency (F, F+$\Delta f$) signals derived from oscillators 10 and 11 in mixer 15 with variable frequency $f$ derived from oscillator 16. The resulting frequencies $f_2$ and $f_3$ of the signals derived from mixer 15 are $$f_2 = F \pm f \tag{1}$$

$$f_3 = F + \Delta f \pm f \tag{2}$$

The frequency $f_p$ of one particular component of the third order intermodulation generated in the test device is $$f_p = f_1 - f_2 + f_3 \tag{3}$$

Substituting equations (1) and (2) in (3), we obtain $$f_p = f_1 + \Delta f \tag{4}$$

It will be noted that for the frequency conditions given, the resulting intermod frequency $f_p$ is a constant.

It can further be shown that if $\Delta f$ is small compared to $f_1$, (i.e., $\Delta f \leq 0.1 f_1$) the magnitude of the intermod signal at frequency $f_p$ is given by $$V_p = V_1 V_2 V_3 k |H_B(f_p)| \, ||H_A(f_1)| \, ||H_A(f)| \quad (5)$$

where k is a constant.

This equation provides the basis for measuring $|H_A(f)|$. By keeping frequency $f_1$, the offset frequency $\Delta f$, and the input voltages $V_1$, $V_2$ and $V_3$ to the test device constant, while varying f, the magnitude of $V_p$ provides a measure of $|H_A(f)|$ as a function of frequency.

To obtain the output transfer characteristics $|H_B(f)|$, one would make a single tone measurement to obtain the overall transfer characteristic of the network and then subtract $|H_A(f)|$.

Figure 3:
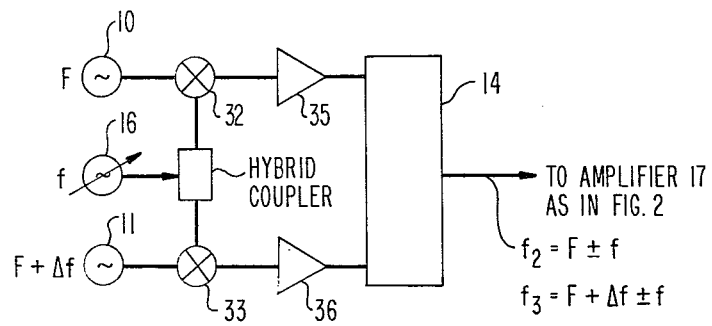
FIG. 3 is an alternative test circuit.

While $f_p$ was given as $f+\Delta f$, it will be recognized that an equally useful frequency is given by $f-\Delta f$. It will also be recognized that the test circuit described is merely illustration. Other circuit arrangements for generating and applying the test tones to the test device can just as readily be devised. For example, FIG. 3 illustrates an alternative arrangement for generating signal frequencies $f_2$ and $f_3$. In this embodiment, each of the fixed frequency oscillators 10 and 11 is coupled to a separate mixer 32 and 33, respectively, along with a signal from variable frequency oscillator 16. The mixer outputs are coupled by way of buffer amplifiers 35 and 36 to coupler 14, whose output is connected, in turn, to amplifier 17. The balance of the network is as shown in FIG. 2.

Variations in the magnitude of $V_p$, as a function of frequency, can be viewed on a suitable display by synchronizing the horizontal sweep of the display with the frequency variations of variable frequency oscillator 16.

I claim:

1. Apparatus for analyzing a two-port network including an input portion having a transfer characteristic $H_A(f)$; an output portion having a transfer characteristic $H_B(f)$; and a resistive nonlinear portion therebetween; said apparatus comprising:
    means (21) for generating a first signal at a frequency $f_1$;
    means (10, 15, 16) for generating a second signal having a variable frequency $f_2$;
    means (11, 15, 16) for generating a third signal having a variable frequency $f_3 = f_2 \pm \Delta f$, where $\Delta f$ is a fixed frequency difference;
    means (20) for applying said signals to said two-port; and
    means (23) for measuring the magnitude of the third order intermodulation distortion generated by said two-port as a function of frequency f.

2. The apparatus according to claim 1 wherein the intermodulation measurement is made at frequency $f_p = f_1 + \Delta f$.

3. The apparatus according to claim 1 wherein the intermodulation measurement is made at frequency $f_p = f_1 - \Delta f$.

4. The apparatus according to claim 1 where the measured intermodulation distortion is proportional to the square of the transfer characteristic $|H_A(f)|$.

5. The apparatus according to claim 1 wherein said second and third signal generating means comprise:
    a first fixed frequency oscillator (10);
    a second fixed frequency oscillator (11);
    a variable frequency oscillator (16);
    and a mixer (15);
    means (14) for combining the signals from said first and second oscillators (10, 11) and for coupling said combined signals to said mixer (15);
    means for coupling said variable frequency oscillator (16) to said mixer (15); and
    means for extracting signals at frequencies $f_2$ and $f_3$ from said mixer.

6. The apparatus according to claim 1 wherein said second and third signal generating means comprise:
    a first fixed frequency oscillator (10);
    a second fixed frequency oscillator (11);
    and a variable frequency oscillator (16);
    a first mixer (32) coupled to said first oscillator (10) and said variable frequency oscillator (16) for generating said second signal having a variable frequency $f_2$;
    a second mixer (33) coupled to said second oscillator (11) and said variable frequency oscillator (16) for generating said third signal having a variable frequency $f_3$; and
    means (14) for combining said second and third signals in a common signal path.

7. A method of analyzing a two-port network including: an input portion having a transfer characteristic $H_A(f)$; an output portion having a transfer characteristic $H_B(f)$; and a resistive nonlinear portion therebetween; said method including the steps of:
    applying to said network a first signal at a fixed frequency $f_1$, a second signal having a variable frequency $f_2$, and a third signal having a variable frequency $f_3 = f_2 \pm \Delta f$ where $\Delta f$ is a fixed frequency difference;
    and measuring the magnitude of the intermodulation distortion generated by said network at frequency $f_p = f_1 \pm \Delta f$, as a function of frequency.

* * * * *